United States Patent
Hunt et al.

[19]

[11] Patent Number: 5,836,506
[45] Date of Patent: Nov. 17, 1998

[54] SPUTTER TARGET/BACKING PLATE ASSEMBLY AND METHOD OF MAKING SAME

[75] Inventors: Thomas J. Hunt, Peekskill; Paul S. Gilman, Suffern, both of N.Y.

[73] Assignees: Sony Corporation, Tokyo, Japan; Materials Research Corporation, Orangeburg, N.Y.

[21] Appl. No.: 426,246

[22] Filed: Apr. 21, 1995

[51] Int. Cl.$^6$ .................................................. B21D 39/00
[52] U.S. Cl. ......................... 228/172; 228/164; 228/170; 228/174; 228/203; 228/205; 228/262.44; 228/262.5; 228/262.6; 228/262.71; 204/298.12; 204/298.13
[58] Field of Search ..................... 228/164, 170, 228/172, 174, 203, 205, 262.44, 262.5, 262.6, 262.71; 204/298.12, 298.13

[56] References Cited

U.S. PATENT DOCUMENTS

| | | | |
|---|---|---|---|
| 3,186,083 | 6/1965 | Wright, Jr. | 228/205 |
| 5,230,459 | 7/1993 | Mueller et al. | 204/298.12 |
| 5,354,446 | 10/1994 | Kida et al. | 204/298.22 |

FOREIGN PATENT DOCUMENTS

| | | |
|---|---|---|
| 0590904 | 9/1993 | European Pat. Off. . |
| 575166 | 12/1993 | European Pat. Off. . |
| 590904 | 4/1994 | European Pat. Off. . |
| 03626470 | 2/1988 | Germany . |
| 62-149866 | 7/1987 | Japan . |
| 149866 | 12/1987 | Japan . |
| 132761 | 8/1989 | Japan . |
| 2-8364 | 1/1990 | Japan . |
| 054761 | 2/1990 | Japan . |
| 301855 | 2/1990 | Japan . |
| 8364 | 3/1990 | Japan . |

OTHER PUBLICATIONS

Banker, John G., "Explosion Welding", *Solid–State Welding Processes*, pp. 303–305.

*Primary Examiner*—Christopher D. Rodee
*Assistant Examiner*—Rodney G. McDonald
*Attorney, Agent, or Firm*—Wood, Herron, & Evans L.L.P.

[57] ABSTRACT

This invention is directed to an improved method for making a bonded sputter target/backing plate assembly as well as assemblies produced therefrom. The assembly includes a sputter target having a bonding surface which is bonded to the bonding surface of an underlying backing plate. The method of forming the bonded assembly includes treating one of the bonding surfaces, either by roughening at least a portion of one of the bonding surfaces so as to produce a roughened portion having a surface roughness ($R_a$) of at least about 120 micro inches, or by drilling a plurality of holes in one of the bonding surfaces. The method further includes orienting the sputter target and backing plate to form an assembly having an interface defined by the bonding surfaces, subjecting the assembly to a controlled atmosphere, heating the assembly, and pressing the assembly so as to bond the bonding surfaces.

27 Claims, 2 Drawing Sheets

SPUTTER TARGET/BACKING PLATE ASSEMBLY AND METHOD OF MAKING SAME

FIELD OF THE INVENTION

This invention pertains to bonded sputter target/backing plate assemblies and methods of making such assemblies. More particularly, in forming such assemblies, one of the bonding surfaces is treated, either by roughening so as to produce a surface roughness of at least about 120 $R_a$, or by drilling a plurality of holes in the bonding surface. This surface treatment assists in forming a mechanical interlock between the sputter target and backing plate in the bonded assembly.

BACKGROUND OF THE INVENTION

Cathodic sputtering is widely used for the deposition of thin layers of material onto desired substrates. Basically, this process requires a gas ion bombardment of the target having a face formed of a desired material that is to be deposited as a thin film or layer on a substrate. Ion bombardment of the target not only causes atoms or molecules of the target materials to be sputtered, but imparts considerable thermal energy to the target. This heat is dissipated beneath or around a backing plate that is positioned in a heat exchange relation with the target. The target forms a part of a cathode assembly which together with an anode is placed in an evacuated chamber filled with an inert gas, preferably argon. A high voltage electrical field is applied across the cathode and the anode. The inert gas is ionized by collision with electrons ejected from the cathode. Positively charged gas ions are attracted to the cathode and, upon impingement with the target surface, dislodge the target material. The dislodged target materials traverse the evacuated enclosure and deposit as a thin film on the desired substrate that is normally located close to the anode.

In addition to the use of an electrical field, increasing sputtering rates have been achieved by the concurrent use of an arch-shaped magnetic field that is superimposed over the electrical field and formed in a closed loop configuration over the surface of the target. These methods are known as magnetron sputtering methods. The arch-shaped magnetic field traps electrons in an annular region adjacent to the target surface, thereby increasing the number of electron-gas atom collisions in the area to produce an increase in the number of positive gas ions in the region that strike the target to dislodge the target material. Accordingly, the target material becomes eroded in a generally annular section of the target face, known as the target raceway.

In a conventional target cathode assembly, the target is attached to a nonmagnetic backing plate. The backing plate is normally water-cooled to carry away the heat generated by the ion bombardment of the target. Magnets are typically arranged beneath the backing plate in well defined positions in order to form the above noted magnetic field in the form of a loop or tunnel extending around the exposed face of the target.

In order to achieve good thermal and electrical contact between the target and the backing plate, these members are commonly attached to each other by use of soldering, brazing, diffusion bonding, clamping or epoxy cements.

To a certain extent soft solders can accommodate stresses exerted on the target/backing plate assembly that occur upon cooling. These stresses can be considerable in light of the significant differences in thermal expansion coefficients that may exist between the target and backing plate metals. However, the relatively low joining temperatures associated with the "soft" solders reduce the temperature range over which the target can be operated during sputtering.

In some cases, in order to overcome the problem of joining one or more nonwettable materials by soldering, precoating with a metal is used to enhance solderability. These coatings may be applied by electroplating, sputtering or other conventional means.

Another method which is applicable and used to some extent in target joining is that of explosive bonding or welding. By this technique, bonds are produced that combine solid state bonding and a mechanical interlocking as a result of the surface irregularities produced in the form of "jetting." The bonds are strong and reliable. The disruption of the initial mating surfaces during the dynamic bonding pulse negates the need for extreme surface cleanliness or preparation. See, e.g., John G. Banker et al., "Explosion Welding", ASM Handbook, Vol. 6, *Welding, Brazing and Soldering;* pp. 303–305 (1993).

Smooth surface diffusion bonding is an applicable method of bonding but has only limited use in the bonding of sputtering target components. The bond is produced by pressing the material surfaces into intimate contact while applying heat to induce metallurgical joining and diffusion to varying extent across the bond interface. Bonding aids, metal combinations which are more readily joined, are sometimes applied to one or both of the surfaces to be bonded. Such coatings may be applied by electroplating, electrolyze plating, sputtering, vapor deposition or other usable technique for depositing an adherent metallic film. It is also possible to incorporate a metallic foil between bonding members which foil has the ability to be more easily bonded to either of the materials to be joined. The surfaces to be joined are prepared by chemical or other means to remove oxides or their chemical films which interfere with bonding.

An additional technique for bonding as described in U.S. Pat. No. 5,230,459 includes the pre-bonding step of providing machined grooves in the surface of one of the components to be solid state bonded. This feature causes disruption of the bond surface of the associated component during heated pressure application. The material having the greater strength or hardness will normally be provided with the grooves such that, during bonding, it will penetrate into the softer member with the softer metal substantially filling the grooves.

Solder bonds of materials with widely differing thermal expansion rates are susceptible to shear failure initiating at the extreme edges of the bond interface when the solder is too weak for the application. The result commonly experienced is debonding during service. The need for intermediate coatings applied to materials that are difficult to wet and solder presents problems including adherence reliability of the applied coating and substantial added cost of applying the coating. The higher melting temperature solders used for high power applications are stronger but are far less forgiving of the stresses developed in the materials system. Targets of large size present greater stress problems as well as greater difficulty of producing sound bonds across the entire bond surface. As sputtering target sizes and power requirements increase, the soft solders become less applicable for joining of the material systems involved.

Explosive bonding is a comparatively costly bonding method. For example, such bonding requires that the materials be provided in an oversized condition to allow for predictable damage at the periphery of the target assembly, thereby adding to material cost. Also, the conditions for achieving acceptable products must be adjusted for different component sizes and combinations of materials, and although the bonds offer good strength, the bond interfaces are variable in physical character. In addition, this method is not applicable to a material system having one component which is brittle or which has limited ductility.

Smooth surface diffusion bonding requires extreme care in preparation and in maintaining surface cleanliness prior to and during the bonding operation to ensure reliable bond qualities. Because the diffusion bond interfaces are planar, they are subject to stressing in simple shear which commonly leads to peeling away at the ends of the bond area. The formation of brittle intermetallics at the bond interface, which increase in thickness with the associated long times of heat exposure, add to the potential of bond shear failure.

Groove bonding is applicable to bonding many dissimilar materials, but is limited to materials that have dissimilar melting temperatures because the process must occur near the melting temperature of the lower melting point alloy. This also precludes the use of this technique for similar metals. It is also possible that the saw tooth nature of the grooves may act as a stress concentrator and promote premature cracking in the alloys near the bonds. Furthermore, machining of the grooves is a time consuming operation.

Accordingly, it is an object of the invention to provide a convenient, inexpensive method for bonding target and backing plate materials that are either similar or dissimilar, that will be capable of withstanding thermal expansion and contraction stresses exerted thereon during and after sputtering.

SUMMARY OF THE INVENTION

This invention is directed to an improved sputter target/backing plate assembly and a method for making such an assembly. The assembly includes a sputter target having a bonding surface which is bonded to the bonding surface of an underlying backing plate. The method of forming the bonded assembly includes treating one of the bonding surfaces, either by roughening at least a portion of one of the bonding surfaces so as to produce a roughened portion having a surface roughness of at least about 120 $R_a$, or by drilling a plurality of holes in one of the bonding surfaces. The method further includes orienting the sputter target and backing plate to form an assembly having an interface defined by the bonding surfaces, subjecting the assembly to a controlled atmosphere, heating the assembly, and pressing the assembly so as to bond the bonding surfaces.

When surface roughening is used, preferably, the surface roughening is accomplished by particle blasting, shot peening, etching or a combination thereof. The roughening step may include roughening substantially the entire bonding surface of at least one of the sputter target and backing plate, or if desired, the surface to be roughened may be masked or covered in such a way as to form a specific roughened pattern, such as a grid-like pattern. In a preferred form of the invention, the roughening step includes roughening at least a portion of the bonding surface of the sputter target, and in a more preferred form, substantially all of the target bonding surface is roughened.

Although the roughened portion should have a surface roughness of at least 120 $R_a$, the surface roughness preferably ranges from about 120 $R_a$ to about 150 $R_a$, and more preferably is about 135 $R_a$ after the roughening step.

When the treating step includes drilling a plurality of holes in one of the bonding surfaces, the holes typically are distributed over substantially all of the bonding surface. Preferably, the holes are spaced approximately one half inch apart from one another, with each of the holes having a diameter of about 3/64 in. and a depth of about 0.065 in. When each hole is machined, some of the metal forms a peripheral burr at the mouth of the hole, which should be retained as a part of the bonding surface. Then when the sputter target and backing plate are bonded together, each burr forms a mechanical interlock with material from the other one of the bonding surfaces in the bonded assembly. When drilled holes are used, the holes preferably are placed in the bonding surface of the sputter target.

The controlled atmosphere used in forming the bonded sputter target/backing plate assembly preferably is a vacuum, inert gas, reducing gas or combination thereof.

Any of a number of different materials may be used for the sputter target and backing plate. Preferably, the sputter target is made of titanium, aluminum, molybdenum, cobalt, chromium, ruthenium, rhodium, palladium, silver, osmium, iridium, platinum, gold, tungsten, silicon, tantalum, vanadium, nickel, iron, manganese or germanium, or an alloy thereof. The backing plate preferably is made of aluminum, copper, steel, or titanium, or an alloy thereof.

In the heating step, the assembly typically is heated to a temperature somewhat below the homologous melting point of the metal used for the backing plate. More specifically, when the backing plate is aluminum or an aluminum alloy, the assembly preferably is heated to a temperature of from about 300° C. to about 575° C., and when copper or a copper alloy is used, the assembly is heated to a temperature of from about 540° C. to about 1015° C. If the backing plate is made of steel, the temperature in the heating step should range from about 730° C. to about 1320° C., while if titanium or a titanium alloy is used, the temperature should be from about 890° to about 1570° C.

In the pressing step, the assembly preferably is pressed at a pressure of from about 30 MPa to about 140 MPa.

One of the benefits of sputter target/backing plate assemblies made according to the method is improved strength and resistance to shear failure, due primarily to the surface treatment of one of the bonding surfaces. This enhanced strength and resistance to bond failure allows such assemblies to be used at higher operational sputtering temperatures and extends the range of target sizes which may be used without compromising structural reliability.

Furthermore, the methods used for treating the bonding surface, such as particle blasting, shot peening, etching and drilling, result in manufacturing time savings and cost savings when compared with the extensive surface preparation required for smooth surface diffusion bonding or with the machining of grooves used in groove bonding. In addition, several prior art methods require lengthy exposure of an assembly to temperatures which can deleteriously alter the microstructure of the target, thereby degrading the target's performance. However, the temperatures used in the present method allow the solid state bond to be formed while minimizing excessive exposure to high temperatures.

These and other benefits and advantages will be apparent to those of ordinary skill in the art on review of the following Figures and detailed description of the invention.

DETAILED DESCRIPTION OF THE INVENTION

Referring to FIGS. 1 through 4, in a preferred form of the invention, a sputter target 10 having a machined bonding surface 12 is prepared for bonding with a backing plate by roughening the machined bonding surface 12. The roughened bonding surface 14 may be formed by any of a number of techniques, including for example, particle blasting, shot peening, etching or a combination thereof. Particle blasting with grit is a preferred method because the equipment generally is readily available and easy to use, and this method produces a more uniformly roughened surface.

Figure 1:
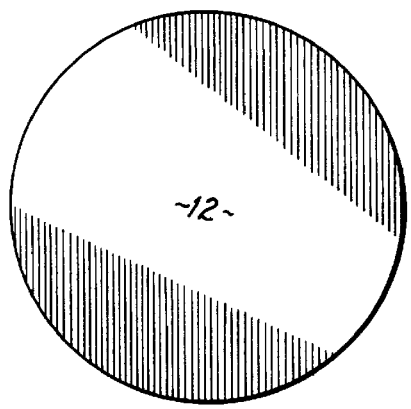
FIG. 1 is a top view of the bonding surface of a sputter target prior to surface roughening.
Figure 2:
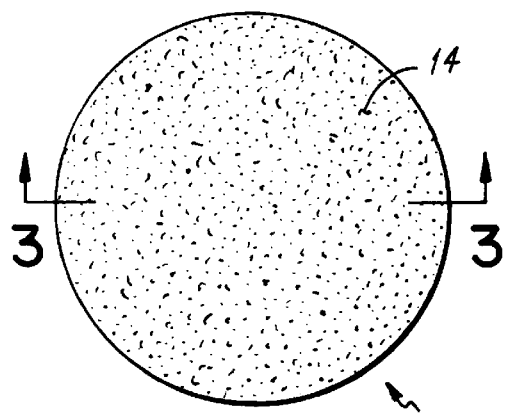
FIG. 2 is a top view of the sputter target of FIG. 1 after surface roughening.
Figure 3:
FIG. 3 is a cross-sectional view of the sputter target of FIG. 2 taken along line 3—3.

As shown in FIGS. 2 and 3, the roughening treatment may be applied substantially to the entire bonding surface 14. However, if desired, the roughening treatment may be applied only to a particular portion or portions of the bonding surface, either in a random fashion or in a particular pattern. A particular pattern may be achieved by masking certain portions of the bonding surface prior to surface roughening. For example, if desired, a grid-like pattern of unroughened bonding surface may be created by masking the unroughened bonding surface with intersecting vertical and horizontal strips of a rubberized tape such as masking tape prior to surface roughening. Furthermore, referring to FIG. 4, in a preferred form of the invention, only the bonding surface 14 of the sputter target 10 receives the roughening treatment, while the bonding surface 18 of the backing plate 16 remains unroughened. However, if desired, the invention may be practiced by roughening at least a portion of the backing plate bonding surface in lieu of roughening the sputter target. Alternatively, the roughening step may include roughening at least a portion of both sputter target and backing plate bonding surfaces.

Figure 4:
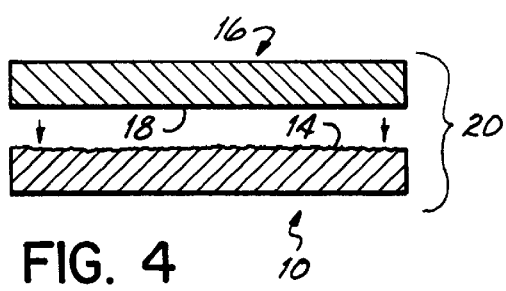
FIG. 4 is an exploded cross-sectional view of an unbonded assembly showing the roughened sputter target of FIG. 3 and a corresponding unroughened backing plate disposed above.

In practicing the invention, the particular surface or surfaces to be roughened should be treated so as to have a surface roughness of at least 120 $R_a$. As used herein, the term "surface roughness" is defined as the arithmetic average deviation of the surface expressed in micro-inches from a mean line or center line, with $R_a$ being the nationally adopted symbol for surface roughness. Preferably, this surface roughness should be from about 120 $R_a$ to about 150 $R_a$, and more preferably is about 135 $R_a$ after the roughening step. As seen in FIGS. 3–4, the roughening step produces an uneven surface topography on the bonding surface treated.

In a preferred method of forming the bonded assembly, the roughened portion is cleaned prior to bonding to remove any particles which may remain after grit blasting, shot peening or etching. Any of a number of different methods may be used to remove the particles, and since this is not a degreasing step, a dry lint-free wipe may be used. If desired, the bonding surface of the unroughened component of the assembly (typically the backing plate when the sputter target is roughened) may be cleaned with an acetone wipe or other degreasing composition, such as isopropyl alcohol or soap and water, to remove machining oils, fingerprints and the like.

Figure 7:
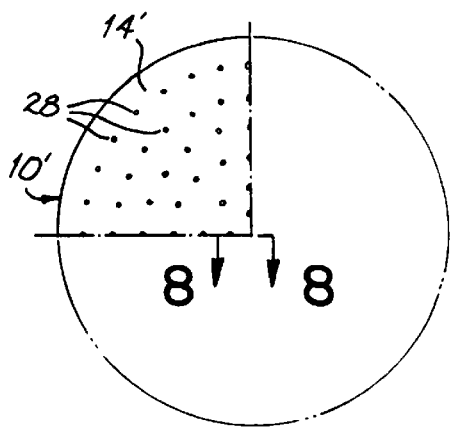
FIG. 7 is a top view of a quadrant of the sputter target of FIG. 1 showing a plurality of holes drilled in the bonding surface.

As an alternative to surface roughening, one of the bonding surfaces may be treated by drilling a plurality of holes in the bonding surface. For example, referring to FIG. 7, a plurality of holes 28 is drilled in the bonding surface 14' of the sputter target 10'. Although only one quadrant is shown, in an actual embodiment, the drilled holes 28 are evenly distributed across the entire bonding surface 14' in generally concentric rings. However, if desired, the drilled holes may be aligned in the bonding surface in any other pattern, such as in the form of a grid, or they may be placed in the bonding surface in a purely random array. In a preferred embodiment, the holes are spaced approximately one half inch apart from one another, and each hole has a diameter of about 3/64 in. and a depth of about 0.065 in.

Figure 8:
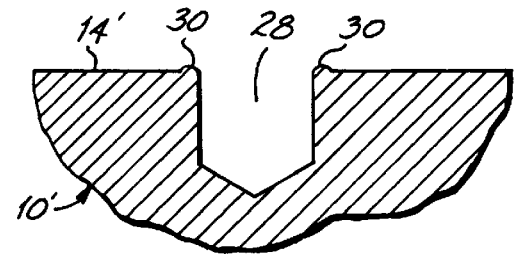
FIG. 8 is a cross-sectional view of a portion of the sputter target of FIG. 7 taken along line 8—8.

Referring to FIG. 8, after each hole 28 has been drilled, it has a peripheral burr or fin 30 at the mouth of the hole 28, formed of excess metal material. These burrs or fins are left intact so that when the sputter target and backing plate are bonded together, the burrs provide a slight mechanical interlock with the metal of the other component, thereby aiding in the bonding of the assembly.

Although it is preferred to drill the holes in the bonding surface of the target, the invention may be practiced by drilling holes in the bonding surface of the backing plate instead, or in both bonding surfaces.

Once one of the bonding surfaces has been treated by surface roughening or drilling of holes as described above, the sputter target and backing plate may be bonded using a technique such as hot isostatic pressing (HIPing) or uniaxial hot pressing (UHPing). Referring to FIG. 4 as an example, the sputter target 10 and backing plate 16 are oriented to form an assembly 20 having an interface defined by their bonding surfaces 14, 18. Then, if UHPing is used, this unbonded assembly is placed between a pair of plungers, platens or rams. These rams are contained within a control chamber which allows for the control of temperature, pressure and other atmospheric conditions.

The controlled atmosphere is a vacuum, reducing gas or inert gas, or a combination thereof. Preferably, the controlled atmosphere is a vacuum of about $10^{-2}$ torr or greater. A vacuum is preferred because it provides more control in preventing reoxidation of the metals. However, if desired, any reducing gas may be used such as, for example, nitrogen with 5 to 10 weight percent of hydrogen. Or, if desired, any inert gas may be used as well.

In addition to adjusting the atmosphere, the temperature in the uniaxial hot press control chamber is increased in order to heat the unbonded assembly. The assembly is heated to a temperature somewhat below the homologous melting point ($T_m$) of the metal used for the backing plate. Preferably, the assembly is heated to a temperature in the range of from about 0.60 $T_m$ to about 0.95 $T_m$, and more preferably, within the range of about 0.75 $T_m$ to about 0.90 $T_m$. Referring to Table 1, these temperature ranges are shown for various metals typically used as the backing plate material. By elevating the temperature of the assembly to a temperature somewhat below the melting point of the backing plate material, the backing plate softens, and upon pressing, forms a tight interface with the treated bonding surface of the sputter target.

TABLE 1

TEMPERATURE VALUES AS A FRACTION OF THE HOMOLOGOUS MELTING POINT $T_m$

| Backing Plate Material | 0.6 $T_m$ | 0.75 $T_m$ | 0.9 $T_m$ | 0.95 $T_m$ |
|---|---|---|---|---|
| Cu | 815° K. | 1015° K. | 1220° K. | 1228° K. |
|    | 542° C. | 742° C. | 947° C. | 1015° C. |
| Steel | 1005° K. | 1255° K. | 1505° K. | 1590° K. |
|    | 732° C. | 982° C. | 1232° C. | 1317° C. |
| Ti | 1165° K. | 1455° K. | 1745° K. | 1844° K. |
|    | 892° C. | 1182° C. | 1472° C. | 1571° C. |
| Al | 573° K. | 723° K. | 823° K. | 848° K. |
|    | 300° C. | 450° C. | 550° C. | 575° C. |

As the assembly is heated, a compressing force is applied on the assembly by the rams in a uniaxial direction. The pressure on the assembly is elevated typically to a range of from abut 30 MPa to about 140 MPa.

The assembly is maintained in the control chamber under these temperature, pressure and atmospheric gas conditions typically for a period of from about 30 minutes to about 60 minutes, thereby forming the bonded sputter target/backing plate assembly.

Alternatively, the assembly may be bonded using hot isostatic pressing (HIPing). If HIPing is used, the treated sputter target and backing plate are oriented to form an assembly having an interface defined by the bonding surfaces, and this assembly is placed within a HIPing canister. Any canister may be used as long as it is deformable and is able to withstand HIPing conditions. Typically, a steel can having a side wall, bottom plate, top plate and sealable opening for pulling a vacuum is used. Once the assembly is placed in the HIPing canister, a vacuum is pulled, typically on the order of $10^{-2}$ torr or greater. This canister then is placed within a HIPing chamber which is adapted to withstand severe temperature and pressure conditions. The ambient atmosphere in the HIPing chamber is replaced with a true inert gas, such as argon or helium. In addition, the temperature and pressure in the HIPing chamber are increased as discussed above with respect to UHPing, in order to form a bonded sputter target/backing plate assembly. Referring to Table 1, the assembly is heated to a temperature somewhat below the homologous melting point of the metal used for the backing plate. Preferably, the assembly is heated to a temperature in the range of from about 0.60 $T_m$ to about 0.95 $T_m$, and more preferably, within the range of about 0.75 $T_m$ to about 0.90 $T_m$. Furthermore, with respect to pressure, the HIPing canister and assembly contained therein are compressed from all sides at a pressure of from about 30 MPa to about 140 MPa. The assembly preferably is maintained at the desired temperature, pressure and atmospheric conditions for a period of about 60 minutes. When metals having different coefficients of expansion are used for the sputter target and backing plate, it is advantageous to remove a portion of the increased pressure from the HIPing chamber while maintaining an elevated temperature, thereby reducing the risk of bond cracking due to tensile stresses.

Figure 5:
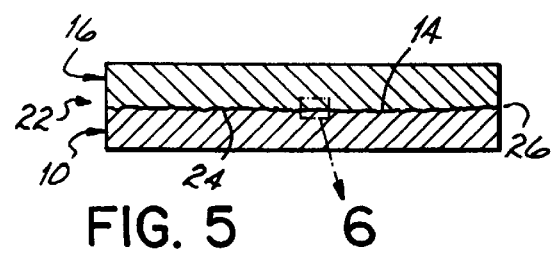
FIG. 5 is a cross-sectional view of a bonded sputter target/backing plate assembly.
Figure 6:
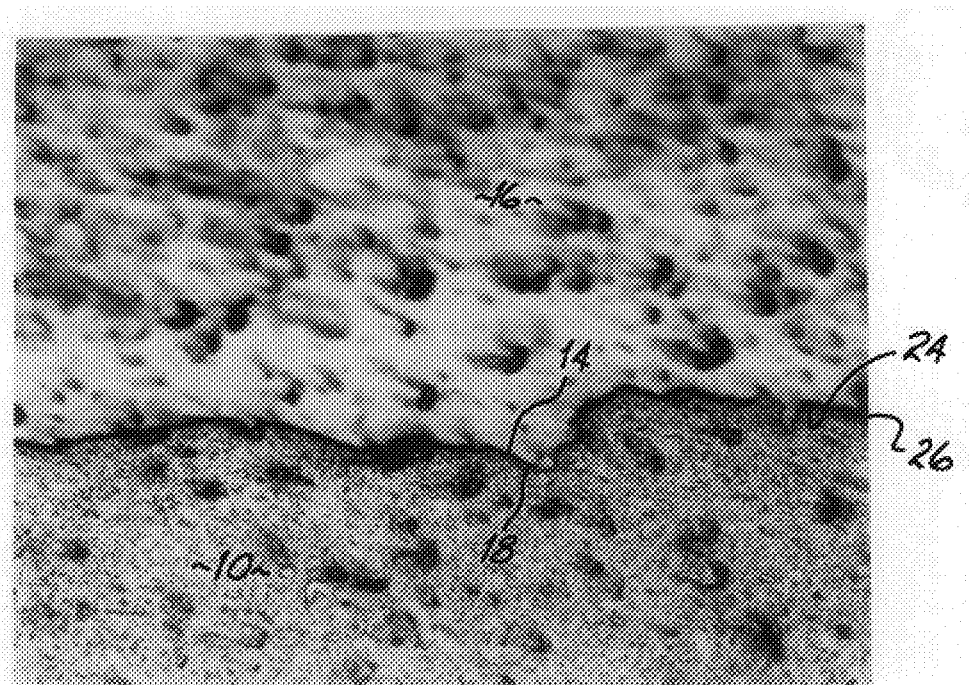
FIG. 6 is a closeup cross-sectional photograph taken at 6 of FIG. 5 showing the bond formed between the bonding surfaces of the sputter target and backing plate at 400× magnification.

As shown in FIGS. 5 and 6, when the roughened sputter target 10 and backing plate 16 are bonded together to form a bonded assembly 22, the roughened bonding surface 14 of the sputter target 10 slightly compresses and deforms the bonding surface 24 of the softer backing plate 16 thereby creating a tight bond interface 26.

Figure 9:
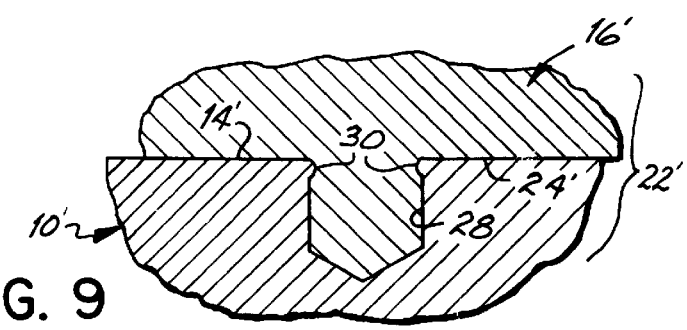
FIG. 9 is a cross-section of the portion of the sputter target shown in FIG. 8 bonded to a backing plate to form a bonded sputter target/backing plate assembly.

Referring to FIG. 9, when the sputter target 10' and backing plate 16' are bonded together to form a bonded assembly 22', metal from the backing plate 16' flows into the drilled holes 28 formed in the bonding surface 14' of the sputter target 10'. Furthermore, as the sputter target 10' and backing plate 16' are pressed together, the peripheral burr 30 at the mouth of each hole is pushed downward and forms a slight mechanical interlock with the backing plate material which has flowed into the hole or cavity 28' in the bonding surface 14' of the sputter target 10', thereby creating a tight bond interface. The bonding surface of the bonded backing plate 16' is shown as item 24'.

The metals used for the sputter target and backing plate may be any of a number of different metals, either in pure or alloy form. For example, the sputter target may be made of titanium, aluminum, molybdenum, cobalt, chromium, ruthenium, rhodium, palladium, silver, osmium, iridium, platinum, gold, tungsten, silicon, tantalum, vanadium, nickel, iron, manganese, germanium, or an alloy thereof. In addition, the backing plate may be made of aluminum, copper, steel, titanium, or an alloy thereof. Preferred sputter target/backing plate metal pairings include a titanium-tungsten target bonded to an aluminum backing plate, a titanium-tungsten target bonded to a titanium backing plate, a titanium target bonded to an aluminum backing plate, an aluminum target bonded to an aluminum backing plate, a titanium target bonded to a titanium backing plate, a molybdenum target bonded to a copper backing plate, a cobalt target bonded to a copper backing plate, a chromium target bonded to a copper backing plate, and a target formed of a precious metal such as ruthenium, rhodium, palladium, silver, osmium, iridium, platinum or gold, bonded to a copper backing plate. If a titanium-tungsten alloy is used, the alloy preferably includes about 10% to 15% titanium by weight.

Although the method has been described in conjunction with a disc-shaped sputter target/backing plate assembly, it will be readily apparent to one of ordinary skill that the method may be used to bond sputter targets and backing plates having any of a number of different shapes and sizes.

EXAMPLES

Example 1
The Formation of Bonded Sputter Target/Backing Plate Assemblies

Several disc-shaped target/backing plate assemblies were produced using pure titanium for the targets and 2024 aluminum for the backing plates. Each disc-shaped target measured 152 mm×15.2 mm, while each disc-shaped backing plate measured 152 mm×25.4 mm. The bonded surface of each of the titanium targets was machined flat, and then several of the targets were given different surface treatments. Two of the targets received a protective covering of masking tape formed in a grid on the bonding surface. Strips of 5 mm wide tape were spaced 10 mm apart in both vertical and horizontal directions on the bonding surface. These masked sputter targets were grit-blasted using the following procedure. Each target was placed in a grit blast cabinet, and the air pressure on the grit blast machine was set to 60 psi. Then, using grit No. 46, the bonding surface of the target was grit-blasted by holding the grit blast nozzle at a 45° angle approximately 1.5 in. to 2 in. from the bonding surface. The grit blasting was continued in a sweeping motion until all exposed target bonding surfaces had a rough gray surface. Then, compressed air was used to blow any loose particles off the target, the masking tape was removed and the target bonding surface was cleaned with alcohol. Two additional target samples were entirely grit-blasted using the above procedure, but without any masking or covering protecting any portion of the bonding surface.

Several other titanium targets were prepared for bonding by drilling holes in the target bonding surface. For two of the target samples, holes were drilled in a grid-like pattern approximately 0.4 in. apart from each other. Each hole had a width of about 3/64 in. and a depth of about 0.065 in. For two other samples, holes having the same width and depth were used; however, these holes were formed in a concentric-ring pattern and were spaced approximately 0.5 in. apart from each other.

Each of the titanium targets was then paired with a 2024 aluminum backing plate and loaded into an evacuated steel hot isostatic press can. Each can was then hot isostatically pressed (HIPed) in order to form a bonded assembly. Once a press can containing an assembly was loaded into the HIPing control chamber, the chamber was filled with argon and the temperature and pressure increased to a temperature of about 900° F. and a pressure of about 6000 psi. The sputter target/backing plate assembly was maintained under these conditions for about 60 minutes, at which point the pressure was reduced quickly from 6000 psi to about 5000 psi, which cooled the assembly somewhat. Then, the assembly was cooled to ambient temperature by reducing the temperature by approximately 120° F. every hour. In addition, the pressure in the HIPing chamber was returned to ambient pressure over that same time period. Each of the target/backing plate assemblies discussed above was hot isostatically pressed using the same process.

Example 2
Measurement of Bond Integrity

The bond integrity of each of the titanium/aluminum assemblies formed in Example 1 was measured by ultrasonic techniques to determine the percentage of the bond surface actually bonded. Two samples were tested for each surface preparation type, with averaged ultrasonic results given in Table 2.

TABLE 2

| Surface Preparation | % Surface Bonded-Ultrasonic |
| --- | --- |
| Smooth Surface | 99 |
| Grit-blasted (no mask) | 100 |
| Grit-blasted (mask) | 100 |
| Drilled Holes (concentric rings) | 100 |
| Drilled Holes (grid) | 100 |

The grit-blasted assemblies and the assemblies employing drilled holes showed 100% bonding while the smooth surface assembly was approximately 99% bonded.

Example 3
Tensile Strength of the Bonds

The loaded assemblies formed in Example 1 were sectioned into bars 101.6 mm long by 25.4 mm wide. Then, a hole was drilled through each bonded assembly near one end, perpendicular to the bond interface, and a 25.4 mm deep saw cut was made from that same end, along the plane of the bond interface to prepare for tensile testing. Tensile tests then were run using an Instron Universal Testing Machine Model TTC. The samples were pulled in tension with the direction of applied stress perpendicular to the bond. Two samples were tested for each surface preparation type, and the average of the two tensile test results for each bond are given in Table 3.

TABLE 3

| Surface Preparation | Tensile Strength at Bond Failure |
| --- | --- |
| Smooth Surface | 5.16 MPa |
| Grit-blasted (no mask) | 11.8 MPa |
| Grit-blasted (mask) | 12.7 MPa |
| Drilled Holes (concentric rings) | 8.3 MPa |
| Drilled Holes (grid) | 13.4 MPa |

The tensile strengths at failure of the grit-blasted and drilled-hole samples are approximately twice that for the smooth samples.

The preferred embodiments and examples discussed above are provided by way of illustration only and are not intended to limit the scope of the invention, which is to be determined by the following claims:

What is claimed is:

1. A method of forming a bonded sputter target/backing plate assembly comprising a sputter target having a bonding surface, and an underlying backing plate having a bonding surface, comprising the steps of:

providing a self-supporting sputter target having a bonding surface, and a backing plate having a bonding surface;

treating one of said bonding surfaces with a treatment selected from the group consisting of:
(i) roughening at least a portion of one of said bonding surfaces so as to produce a roughened portion having a surface roughness ($R_a$) of at least about 120 micro-inches; and
(ii) drilling a plurality of holes in one of said bonding surfaces;

orienting said sputter target and backing plate to form an assembly having an interface defined by said bonding surfaces;

subjecting said assembly to a controlled atmosphere;

heating said assembly; and pressing said assembly so as to bond said bonding surfaces.

2. The method of claim 1 wherein said treating step is roughening at least a portion of one of said bonding surfaces so as to produce a roughened portion having a surface roughness ($R_a$) of at least about 120 micro-inches.

3. The method of claim 2 wherein said roughened portion has a surface roughness ($R_a$) of from about 120 micro-inches to about 150 micro-inches after said roughening step.

4. The method of claim 3 wherein said roughened portion has a surface roughness ($R_a$) of about 135 micro-inches after said roughening step.

5. The method of claim 2 wherein said bonding surface is roughened by a technique selected from the group consisting of particle blasting, shot peening and etching, and combinations thereof.

6. The method of claim 2 wherein said roughening step includes roughening substantially the entire bonding surface of at least one of said sputter target and backing plate.

7. The method of claim 2 wherein said roughening step includes roughening the bonding surface of at least one of said sputter target and backing plate so as to form a specific pattern on said bonding surface.

8. The method of claim 7 wherein said specific pattern is a grid pattern.

9. The method of claim 2 wherein said roughening step includes roughening the bonding surface of the sputter target.

10. The method of claim 1 wherein said treating step is drilling a plurality of holes in one of said bonding surfaces.

11. The method of claim 10 wherein said holes are distributed over substantially all of said bonding surface.

12. The method of claim 11 wherein said holes are spaced approximately ½ inch apart from each other.

13. The method of claim 12 wherein each of said holes has a diameter of about 3/64 inch and a depth of about 0.065 in.

14. The method of claim 10 wherein each of said holes includes a peripheral burr at the mouth of said hole, said burr forming a mechanical interlock with the other one of said bonding surfaces in the bonded assembly.

15. The method of claim 10 wherein said drilling step includes drilling the plurality of holes in the bonding surface of the sputter target.

16. The method of claim 1 wherein said controlled atmosphere is selected from the group consisting of a vacuum, inert gas, reducing gas and combinations thereof.

17. The method of claim 1 wherein the backing plate is made of a metal selected from the group consisting of aluminum, copper, steel, titanium and alloys thereof.

18. The method of claim 1 wherein the sputter target is made of a metal selected from the group consisting of titanium, aluminum, molybdenum, cobalt, chromium, ruthenium, rhodium, palladium, silver, osmium, iridium, platinum, gold, tungsten, silicon, tantalum, vanadium, nickel, iron, manganese, germanium and alloys thereof.

19. The method of claim 17 wherein said backing plate is made of aluminum or an aluminum alloy and said heating step includes heating said assembly to a temperature of from about 300° C. to about 575° C.

20. The method of claim 17 wherein said backing plate is made of copper or a copper alloy and said heating step includes heating said assembly to a temperature of from about 540° C. to about 1015° C.

21. The method of claim 17 wherein said backing plate is made of steel and said heating step includes heating said assembly to a temperature of from about 730° C. to about 1320° C.

22. The method of claim 17 wherein said backing plate is made of titanium or a titanium alloy and said heating step includes heating said assembly to a temperature of from about 890° C. to about 1570° C.

23. The method of claim 1 wherein said pressing step includes pressing said assembly at a pressure of from about 30 MPa to about 140 MPa.

24. The method of claim 17 wherein said backing plate is made of aluminum or an aluminum alloy and said heating step includes heating said assembly to a temperature of from about 450° C. to about 550° C.

25. The method of claim 17 wherein said backing plate is made of copper or a copper alloy and said heating step includes heating said assembly to a temperature of from about 742° C. to about 947° C.

26. The method of claim 17 wherein said backing plate is made of steel and said heating step includes heating said assembly to a temperature of from about 982° C. to about 1232° C.

27. The method of claim 17 wherein said backing plate is made of titanium or a titanium alloy and said heating step includes heating said assembly to a temperature of from about 1182° C. to about 1472° C.

\* \* \* \* \*

UNITED STATES PATENT AND TRADEMARK OFFICE
CERTIFICATE OF CORRECTION

PATENT NO.    : 5,836,506

DATED         : November 17, 1998

INVENTOR(S)   : Thomas J. Hunt and Paul S. Gilman

It is certified that error appears in the above-identified patent and that said Letters Patent is hereby corrected as shown below:

Column 2, Line 30, "electrolyze plating" should read --electroless plating--.

Column 6, line 26, "a diameter of about 3/64 in. and a depth of about 0.065 in" should read --a diameter of about 3/64 inch and a depth of about 0.065 inch.--

Column 7, line 26, "from abut" should be --from about--

Column 11, Claim 13, "a depth of about 0.065 in." should read --a depth of about 0.065 inch.--

Signed and Sealed this

Ninth Day of November, 1999

Attest:

Q. TODD DICKINSON

*Attesting Officer*          *Acting Commissioner of Patents and Trademarks*